US007372693B1

(12) United States Patent

Feroli et al.

(10) Patent No.: US 7,372,693 B1

(45) Date of Patent: May 13, 2008

(54) DATA STORAGE SYSTEM WITH IMPROVED POWER SUPPLY INSTALLATION MECHANISM

(75) Inventors: Lawrence J. Feroli, W. Townsend, MA (US); Joseph P. King, Jr., Sterling, MA (US); Albert F. Beinor, Jr., Sutton, MA (US); W. Brian Cunningham, Westborough, MA (US); C. Ilhan Gundogan, Lexington, MA (US)

(73) Assignee: EMC Corporation, Hopkinton, MA (US)

( * ) Notice: Subject to any disclaimer, the term of this patent is extended or adjusted under 35 U.S.C. 154(b) by 401 days.

(21) Appl. No.: 10/812,442

(22) Filed: Mar. 30, 2004

(51) Int. Cl.
*H05K 7/14* (2006.01)

(52) U.S. Cl. ....................... 361/679; 439/544; 361/725

(58) Field of Classification Search ................ 429/557; 439/565, 567, 549, 544; 361/679, 725
See application file for complete search history.

(56) References Cited

U.S. PATENT DOCUMENTS

RE32,760 E * 10/1988 Chandler et al. ........... 439/188
4,884,981 A * 12/1989 Chandler et al. ........... 439/610
5,366,388 A * 11/1994 Freeman et al. ......... 439/540.1
5,525,074 A * 6/1996 Tsuji et al. ................. 439/555
5,589,665 A 12/1996 Scamacca .................... 174/67
5,727,963 A * 3/1998 LeMaster .................... 439/358
5,842,030 A * 11/1998 Larabell et al. ............ 713/340
6,328,590 B1 12/2001 Linnell ....................... 439/352
6,411,526 B1 * 6/2002 Nguyen et al. ............ 361/829
6,435,916 B1 * 8/2002 Amberg et al. ............ 439/651
6,609,916 B2 * 8/2003 Okabe ......................... 439/77
6,737,582 B2 * 5/2004 Van Lieu et al. ............ 174/53
6,913,473 B2 * 7/2005 Schmid et al. ............. 439/136
6,939,161 B1 9/2005 Yi et al. ..................... 439/373
2004/0066622 A1 * 4/2004 Wang ......................... 361/695
2005/0161248 A1 * 7/2005 Spruell .................. 174/120 R

* cited by examiner

*Primary Examiner*—Jayprakash Gandhi
*Assistant Examiner*—Ingrid Wright
(74) *Attorney, Agent, or Firm*—BainwoodHuang

(57) ABSTRACT

A device fastens a plug of a power cord to a frame which is configured to support a power supply. The device includes a body configured to attach to an installation location of the frame and substantially hold the plug at the installation location of the frame when the power supply connects with and disconnects from the plug. The body includes a first end wall, a second end wall, and lateral walls which connect the first end wall and the second end wall together. When the body substantially holds the plug at the installation location of the frame and when the body is attached to the installation location of the frame, the walls operate to reliably hold the plug in place to enable robust blind mating of the plug with the power supply.

27 Claims, 6 Drawing Sheets

DATA STORAGE SYSTEM WITH IMPROVED POWER SUPPLY INSTALLATION MECHANISM

BACKGROUND

A data storage system stores and retrieves data on behalf of one or more external hosts. A typical data storage system includes a housing, storage processing circuitry and a power supply. The housing structurally supports both the storage processing circuitry and the power supply, as well as guards the storage processing circuitry and the power supply against damage (e.g., against dust, against inadvertent contact with an object moving in the vicinity, against tampering, etc.).

To setup the data storage system, a user connects a power cord between the power supply and an external power source. In particular, at the back of the system, the user plugs one end of the power cord into a corresponding plug on the back of the power supply, and another end of the power cord into the external power source, e.g., a common wall outlet, a battery backup device connected to a wall outlet, etc. At this point, the user turns the data storage system on and the data storage system is ready for operation.

During operation, the power supply provides power to the storage processing circuitry. Under such power, the storage processing circuitry performs a variety of data storage operations (e.g., load and store operations on an array of disk drives, etc.).

SUMMARY

Unfortunately, there are deficiencies to the above-described conventional data storage system. For example, in one conventional data storage system, the storage processing circuitry has two storage processing units for fault tolerance. In this situation, each storage processing unit has access to its own respective power supply and its own respective power cord leading from the data storage system housing to an external power source. If one power supply fails, the data storage system loses only the storage processing unit that received power from the failed power supply. The storage processing unit having access to the remaining power supply is capable of continuing to perform data storage operations since it has not lost power. Accordingly, the data storage system as a whole remains operational.

In such a situation, it would be convenient for the user to manually replace the failed power supply while the data storage system continues to operate thus providing no down time, i.e., no time in which the system is completely unavailable. However, the user is unable to simply slide out the failed power supply because the power cord remains connected to the back of the power supply. Accordingly, the user must go to the back of the system and unplug the power cord from the failed power supply. Next, the user must remove the failed power supply from the housing and install a new power supply into the housing. Then, at the back of the system, the user must connect the power cord to the back of the new power supply. Thus, the procedure for replacing a failed power supply in the above-described conventional data storage system is awkward (e.g., the user must work at the back of the system while the system is running) and cumbersome (e.g., the user must handle power cords while the system is running).

In contrast to the above-described conventional data storage system which requires a user to disconnect and connect a power cord at the back of the system when replacing a failed power supply, embodiments of the invention are directed to techniques for fastening a plug of a power cord to a frame which is configured to support a power supply. Such techniques enable a user connect the power supply to an external power source (e.g., when replacing a failed power supply) by simply inserting the power supply into the frame from a front of the system. In particular, since the plug of the power cord fastens to the frame, a user at the front of the system is able to simply remove a failed power supply, and subsequently insert a new power supply in a blind mating manner, i.e., the plug of the power cord robustly connects with a corresponding plug at the back of the power supply as the user at the front of the system moves the new power supply into the frame. There is no need for the user to go to the back of the system and handle a power cord directly. Furthermore, such techniques conveniently facilitate swapping of power supplies while other portions of the data storage system remain in operation.

One embodiment of the invention is directed to a device for fastening a plug of a power cord to a frame which is configured to support a power supply. The device includes a body configured to attach to an installation location of the frame and substantially hold the plug at the installation location of the frame when the power supply connects with and disconnects from the plug. The body includes a first end wall, a second end wall, and lateral walls which connect the first end wall and the second end wall together. When the body substantially holds the plug at the installation location of the frame and when the body is attached to the installation location of the frame, portions of the body provide reliable restraint on the plug. In particular, the first end wall is configured to restrain the plug in a positive Z-direction relative to the frame. Additionally, the second end wall is configured to restrain the plug in a negative Z-direction relative to the frame, the negative Z-direction being opposite to the positive Z-direction along a Z-axis. Furthermore, the lateral walls are configured to register the plug relative to the frame in an X-Y plane which is perpendicular to the Z-axis.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to techniques for fastening a plug of a power cord to a frame which is configured to support a power supply. Such techniques enable a user connect the power supply to an external power source by simply inserting the power supply into the frame from a front of the system. Since the plug of the power cord fastens to the frame, a user at the front of the system is able to simply remove a failed power supply, and subsequently insert a new power supply in a blind mating manner, i.e., the plug of the power cord robustly connects with a corresponding plug at the back of the power supply as the user at the front of the system moves the new power supply into the frame. There is no need for the user to go to the back of the system and handle a power cord directly. Furthermore, such techniques conveniently facilitate swapping of power supplies while other portions of the data storage system remain in operation.

Figure 1:
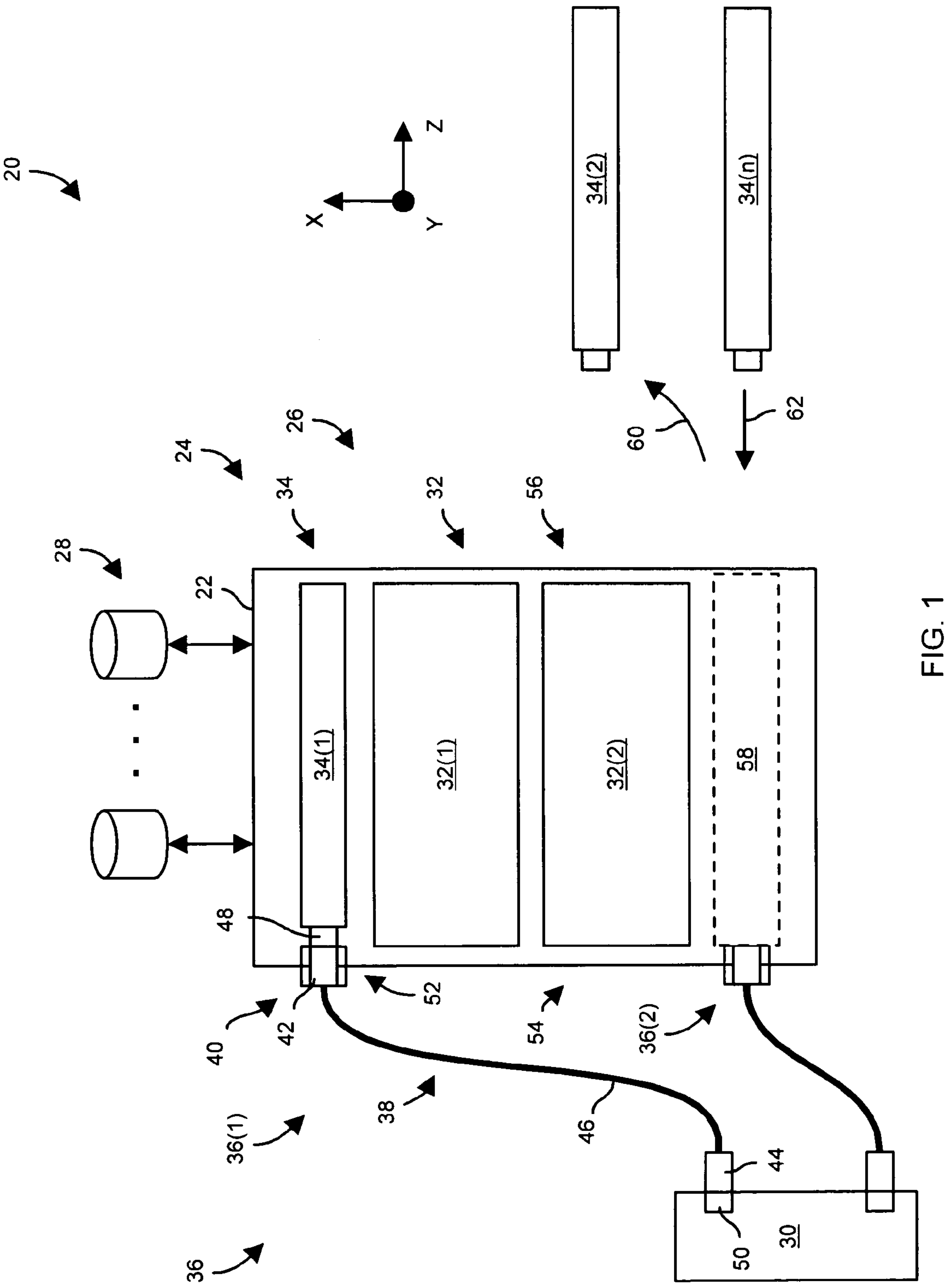
FIG. 1 is a block diagram of a data storage system which is suitable for use by the invention.

FIG. 1 shows a data storage system 20 which is suitable for use by the invention. The data storage system 20 includes a frame 22, a power subsystem 24, operating circuitry 26, and a set of storage devices 28 (e.g., an array of disk drives). The frame 22 is configured to provide mechanical support to the power subsystem 24, the operating circuitry 26 and the storage devices 28. The power subsystem 24 is configured to connect to an external power source 30 and to deliver power to the operating circuitry 26 and the set of storage devices 28. The operating circuitry 24 is configured to perform a variety of data storage operations (e.g., caching operations, load and store operations on the storage devices 28, etc.) on behalf of one or more external hosts.

By way of example only, the operating circuitry 26 includes multiple storage processing units 32(1), 32(2) (collectively, storage processing units 32), and the power subsystem 24 includes (i) multiple power supplies 34(1), 34(2) (collectively, power supplies 34) and (ii) multiple power cord assemblies 36(1), 36(2) (collectively, power cord assemblies 36) which are configured to respectively connect the power supplies 34 to the external power source 30. Each power supply 34 is configured to provide power to a respective storage processing unit 32 and to the set of storage devices 28, and each storage processing unit 32 is configured to perform data storage operations individually for high availability. Accordingly, if one of the power supplies 34 fails (e.g., the power supply 34(2)), the remaining power supply 34 (e.g., the power supply 34(1)) is capable of continuing to provide power to its respective storage processing unit 32 (e.g., the storage processing unit 32(1)) thus enabling that storage processing unit 32 to continue to perform data storage operations. As a result, the data storage system 20 as a whole remains in operation.

As shown in FIG. 1, each power cord assembly 36 includes a power cord 38 and a fastening device 40. Each power cord 38 includes a first plug 42 (e.g., a female plug), a second plug 44 (e.g., a male plug), and a cable 46 which interconnects the first plug 42 and the second plug 44 together. The first plug 42 is configured to mate with a corresponding connector 48 of a power supply 34. Similarly, the second plug 44 is configured to mate with a corresponding connector 50 of the external power source 30 (e.g., a wall outlet, a battery backup/surge suppressor unit connected to a wall outlet, etc.).

As further shown in FIG. 1, the fastening device 40 is configured to fit around the first plug 42 and fasten the first plug 42 to an installation location 52 at a back 54 of the frame 22. In particular, the fastening device 40 provides robust attachment of the first plug 42 to the frame 22 thus enabling a user to connect a power supply 34 to the first plug 42 in a blind mating manner. That is, the user is capable of properly engaging the first plug 42 with the connector 48 of the power supply 34 with adequate contact wipe for robust mechanical and electrical connectivity without directly touching either the first plug 42 or the connector 48 in the process. Accordingly, if the user needs to replace a failed power supply 34, the user does not need to go to the back 54 of the frame 22 and handle any wires. Rather, the user simply stays at the front 56 of the frame 22 and replaces the failed power supply 34.

To this end, suppose that the power supply 34(2) fails but that the data storage system 20 as a whole remains in operation because the power supply 34(1) continues to provide power to the storage processing unit 32(1) and the storage devices 28. In this situation, the user is capable of leaving the data storage system 20 on, and simply pulls the failed power supply 34(2) in the positive Z-direction along the Z-axis until the failed power supply 34(2) moves out of its location 58 (e.g., a power supply slot) through the front 56 of the frame 22 (e.g., see the arrow 60 in FIG. 1). The power supply connector 48 and the first plug 42 disconnect since the fastening device 40 firmly holds the first plug 42 at its respective location 52 at the back 54 of the frame 22.

Next, the user pushes a new power supply 34(*n*) in the negative Z-direction along the Z-axis so that the new power supply 32(*n*) moves into the location 58 through the front 56 of the frame 22 (e.g., see the arrow 62 in FIG. 1). The fastening device 40 provides restraint on the plug 42 as the power supply 32(*n*) engages with the plug 42. The fastening device 40 properly holds the first plug 42 relative to the frame 22 for proper registration in the X-Y plane and in a proper orientation for successful blind mating of the first plug 42 with the power supply connector 48 of the new power supply 32(*n*). At this point, the power supply 32(*n*) is properly seated within the location 58, and there is robust mechanical and electrical contact between the first plug 42 and the connector 48 to enable the power supply 32(*n*) to undertake the normal operation of powering the storage processing unit 32(2) and contributing power to the storage device 28 (e.g., in a common power sharing manner). Moreover, such power supply replacement is capable of occurring safely in a hot-swapping manner while the data storage system 20 continues to operate. In particular, all user activity takes place at the front 56 of the frame 22 thus alleviating the need for the user to awkwardly work at the back 54 and thus alleviating the need for the user to directly handle the power cord assemblies 36 during the replacement process. Further details of the invention will now be provided with reference to FIGS. 2 and 3.

Figure 2:
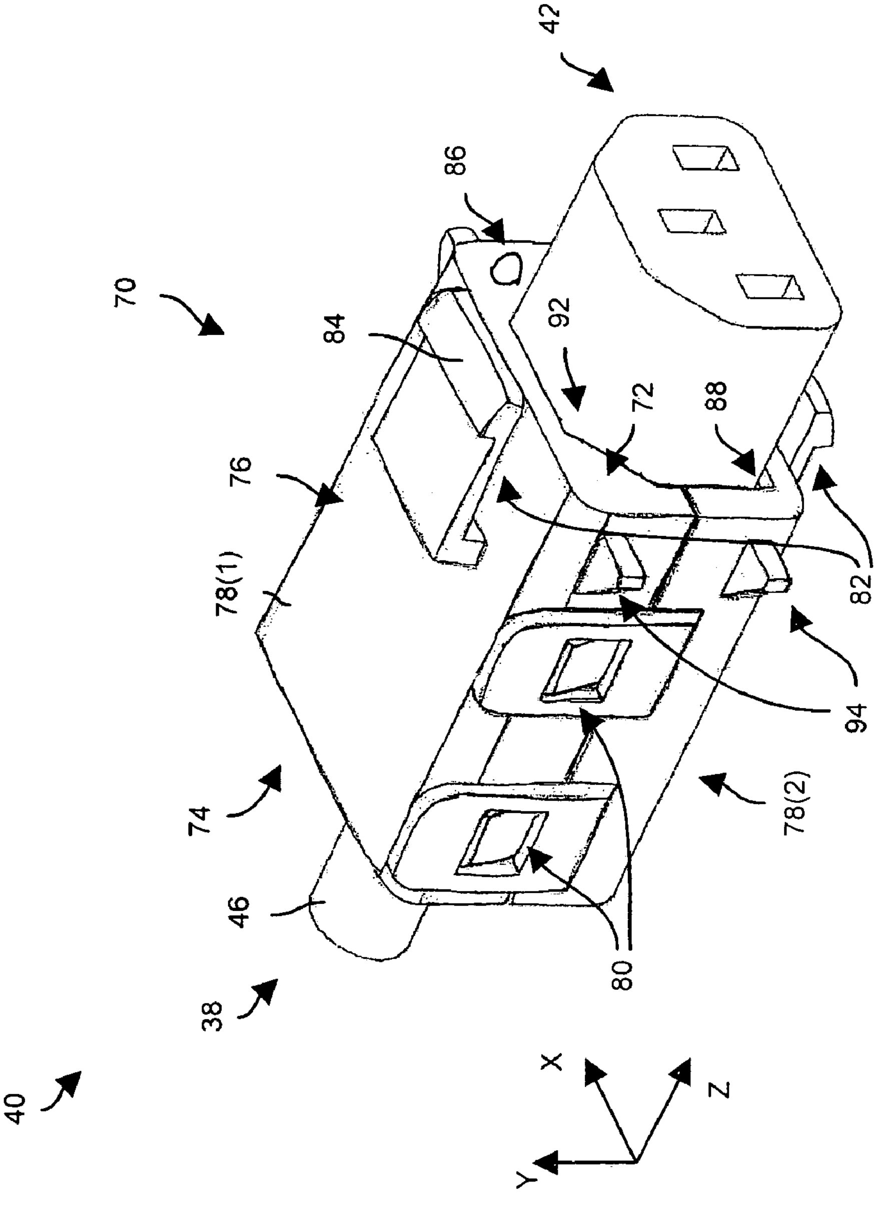
FIG. 2 is a perspective view of a fastening device of the data storage system of FIG. 1.
Figure 3:
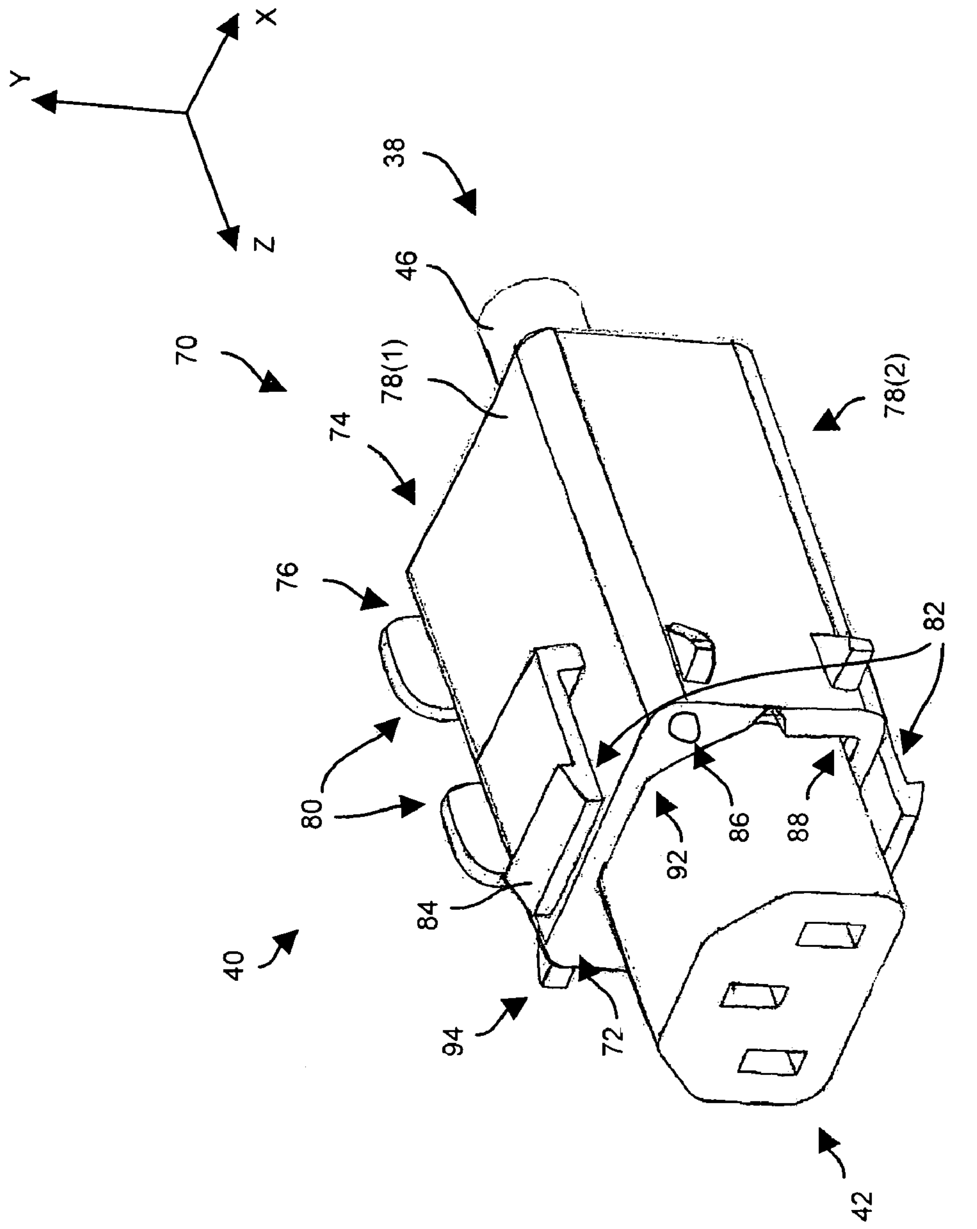
FIG. 3 is a perspective view of the fastening device of FIG. 2 from a different angle.

FIGS. 2 and 3 show the fastening device 40 and the first plug 42 of a power cord 38 at different frontal angles. The fastening device 40 has body 70 which is configured to attach to an installation location 52 at the back of the frame 22 (also see FIG. 1). During such operation, the body 70 substantially restrains the first plug 42 from significant movement when a power supply 32 connects with and disconnects from the plug 42.

As shown in FIGS. 2 and 3, the body 70 includes a first end wall 72, a second end wall 74, and lateral walls 76 which connect the first end wall 72 and the second end wall 74 together. When the body 70 holds the plug 42 at an installation location 52 of the frame 22, the first end wall 72 is configured to restrain the plug 42 in the positive Z-direction relative to the frame 22. Similarly, the second end wall 74 is configured to restrain the plug 42 in the negative Z-direction relative to the frame 22. The lateral walls 76 are configured to register the plug 42 relative to the frame 22 in an X-Y plane with a proper orientation for correct mating with a power supply 32.

As further shown in FIGS. 2 and 3, the body 70 includes multiple body members 78(1), 78(2) which enable the body 70 to encapsulate the plug 42. The body 70 defines a set of locking structures 80 and a set of tabs 82. The locking structures 80 operate to hold the members 78(1), 78(2) together and thus robustly contain the plug 42. In particular, a user is capable of simply fitting the plug 42 into a first member 78(1), 78(2), and then closing the second member 78(1), 78(2) over the first member 78(1), 78(2) until the locking structures 80 lock together to robustly capture the plug 42. As a result, the manufacturer of the data storage system 20 is capable of providing, as the power cord 38, a standard off-the-shelf power cord thus minimizing costs (e.g., there is no added assembly or customization needed for the power cord 38).

To install the fastening device 40 at an installation location 52 of at the back of the frame 22, the user simply pushes the device 40 with the encapsulated plug 42 through a hole in the frame 22. As the fastening device 40 passes through the hole, the edges of the frame 22 around the hole deflect the tabs 82 toward the plug 42 thus enabling the fastening device 40 to continue moving through the hole. Once the tabs 82 have passed through the hole, the tabs 82 spring back away from the plug 42 due to resiliency in the material of the body 70 thus locking the fastening device 40 within the hole of the frame 22 at the location 52. By way of example only, the body 70 has two tabs 82 with ramped portions 84 to facilitate installation. Nevertheless, it should be understood that other tab configurations are suitable for use as well.

It should be further understood that the user is capable of removing the fastening device 40 if necessary. To this end, the user pushes the tabs 82 together and toward the plug 42 thus enabling the tabs 82 to clear the edges of the frame 22 around the hole. The user then simply pulls the fastening device 40 out of the hole.

As also shown in FIGS. 2 and 3, the body 70 further includes a key 86 which extends from the first end wall 72. The key 86 is configured to engage an alignment notch (e.g., a tiny groove or aperture in a wall of the frame 22 near each installation location 52) to restrict installation of the fastening device 40 to only one particular rotational orientation. That is, the key 86 enables the body 70 to attach to the frame 22 at the installation location 52 when the body 70 has a first rotational orientation along the Z-axis and inhibits the body 70 from attaching to the frame 22 at the installation location 52 when the body 70 has a second rotational orientation along the Z-axis, i.e., upside down).

As further shown in FIGS. 2 and 3, the member 78(1) defines a set of 90 degree angles 88, and the other member 78(2) defines a set of angles 92 which are substantially greater than 90 degrees (e.g., 135 degrees). This configuration controls rotational orientation of the plug 42 relative to the members 78(1), 78(2) when the plug 42 is encapsulated within the body 70. Accordingly, the user cannot inadvertently encapsulate the plug 42 within the fastening device 40 in an upside down orientation.

It should be understood that the key 86 in combination with the angle configurations of the members 78(1), 78(2) results in the capability of restricting rotational orientation of the plug 42 relative to the frame 22 based on placement of the alignment notch in the frame 22 at the installation location 52. In particular, this prevents the user from inadvertently installing the device 40 and the plug 42 in a wrong orientation which is substantially 180 degrees from the correct orientation.

It should be understood that other features are capable of being included on the body 70 to enhance its operation. For example, stabilizers 94 are provided along the periphery of the lateral wall 76 to interlock the back wall of the frame 22 to the device 40. A distance between the stabilizers 94 and the ramped portions 84 is toleranced to precisely fit the thickness of the back wall of the frame 22. Alternatively, the lateral walls 76 themselves provide an abutting surface for locking to the frame wall. A summary of how a user utilizes the fastening device 40 will now be provided with reference to FIG. 4.

Figure 4:
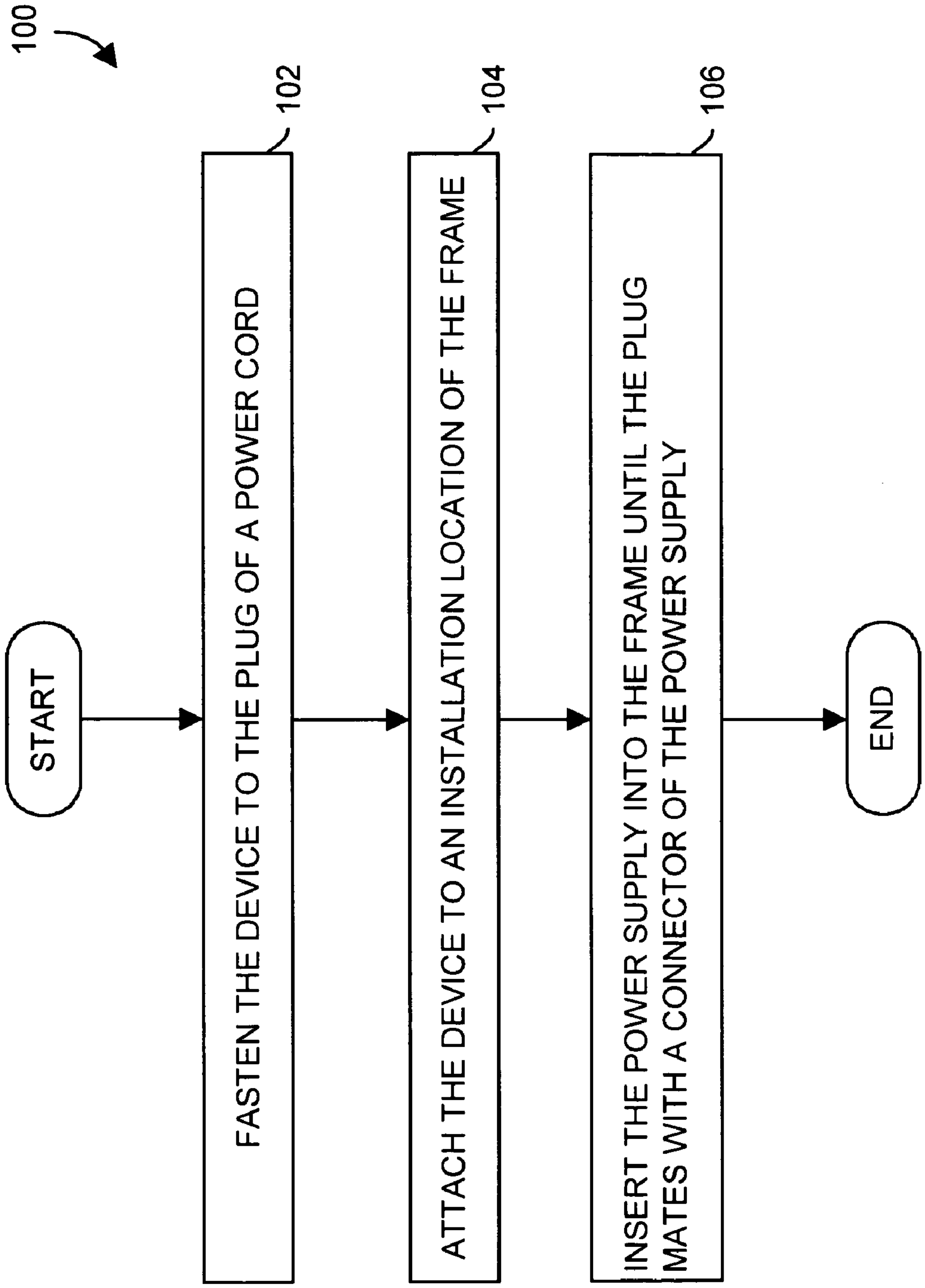
FIG. 4 is a flowchart of a procedure for installing a power supply of the data storage system of FIG. 1.

FIG. 4 shows a procedure 100 which is performed by a user when installing a power supply 32 into the data storage system 20. In step 102, the user fastens the device 40 to the plug 42 of a power cord 38 (also see FIG. 1). As described above, the particular geometry of the body 70 (i.e., the walls 72, 74, 76, the angles defined by the members 78(1), 78(2), etc.) controls the particular position of the plug 42 within the body 70.

In step 104, the user attaches the fastening device 40 to an installation location 52 of the frame 22 of the data storage system 20. As mentioned above, the key 86 and its alignment with a corresponding groove on the back wall of the frame 22 controls the rotational orientation of the device 40 and the plug 42. At this point, the user does not need to access the back of the frame 22 again when installing or replacing a power supply 32.

In step 106, the user inserts a power supply 32 into a power supply location 58 of the frame 22 until the power supply 32 mates with the plug 42 of the power cord 38 (also see FIG. 1). In particular, the connector 48 of the power supply 32 connects with the plug 42 in a blind mating manner without direct handling of either the connector 48 or the plug 42 by the user. Accordingly, connection of the power supply 32 in step 106 is straight forward and not cumbersome.

Moreover, replacement of the power supply 32 simply requires the user to pull out the power supply 32 and perform step 106 with a new power supply 32. The user does not need to awkwardly access the back 54 of the frame 22 or to touch any wires during such replacement. Further details of the invention will now be provided with reference to FIGS. 5 and 6.

Figure 5:
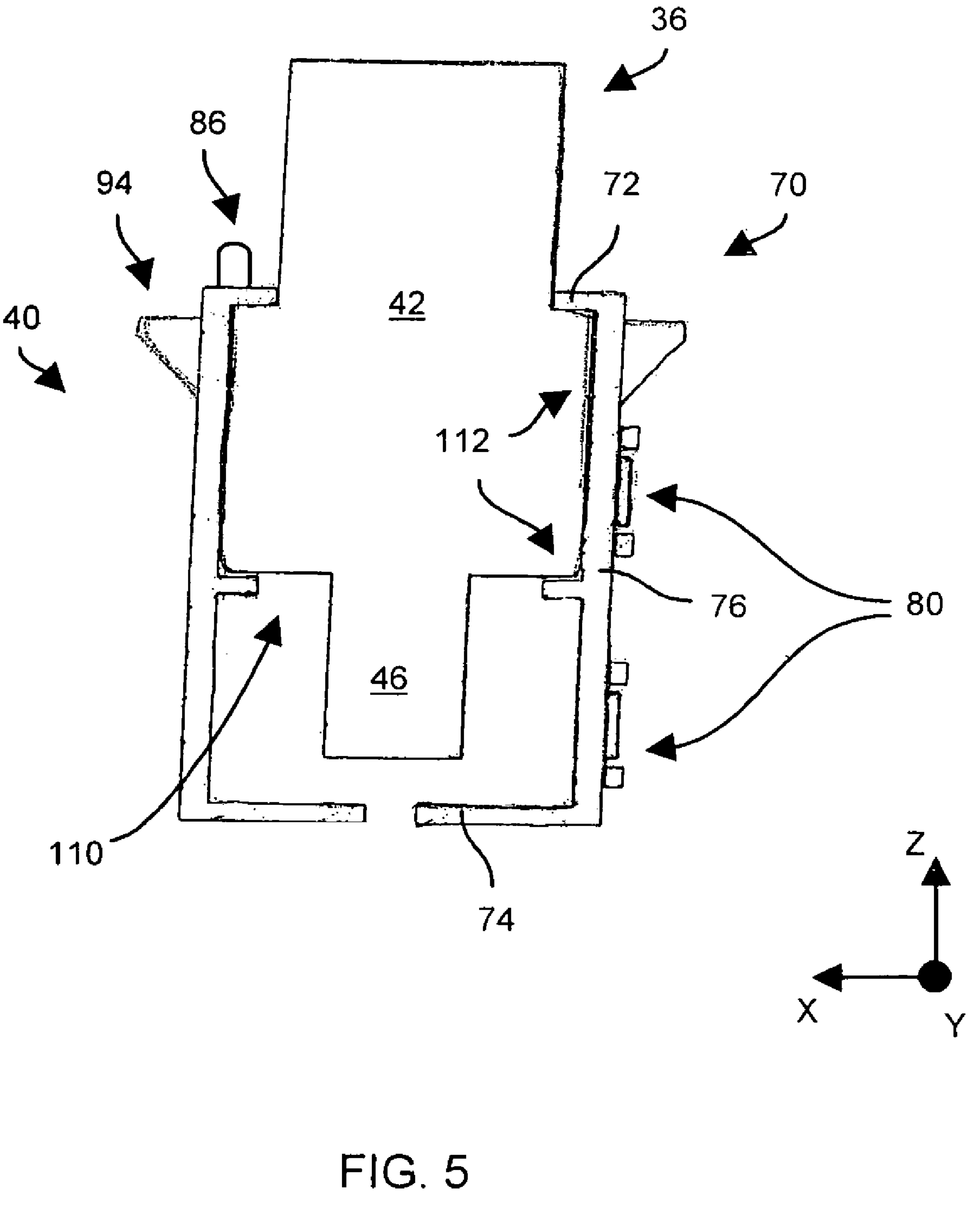
FIG. 5 is a cross-sectional view of the fastening device of FIGS. 2 and 3 when encapsulating a first plug design.

FIG. 5 shows a cross-sectional view of the device 40 and the plug 42 when the plug 42 is encapsulated within the device 40. As shown, the plug 42 has a block-like shape and nestles within a space 110 defined by the walls 72, 74, 76. In particular, contact against various surfaces 112 defined by the wall 72, 74, 76 prevents the plug 42 from substantially moving within the fastening device 40 for a snug and high-toleranced fit.

It should be understood that the surfaces 112 defined by the walls 72, 74, 76 are placed in specific locations to enable compatibility with a different plug configuration than the block-like shaped plug 42 of FIG. 5. Accordingly, the manufacturer is not limited to a single plug design or a single power cord manufacturer. Rather, multiple plug designs are suitable for use by the device 40.

Figure 6:
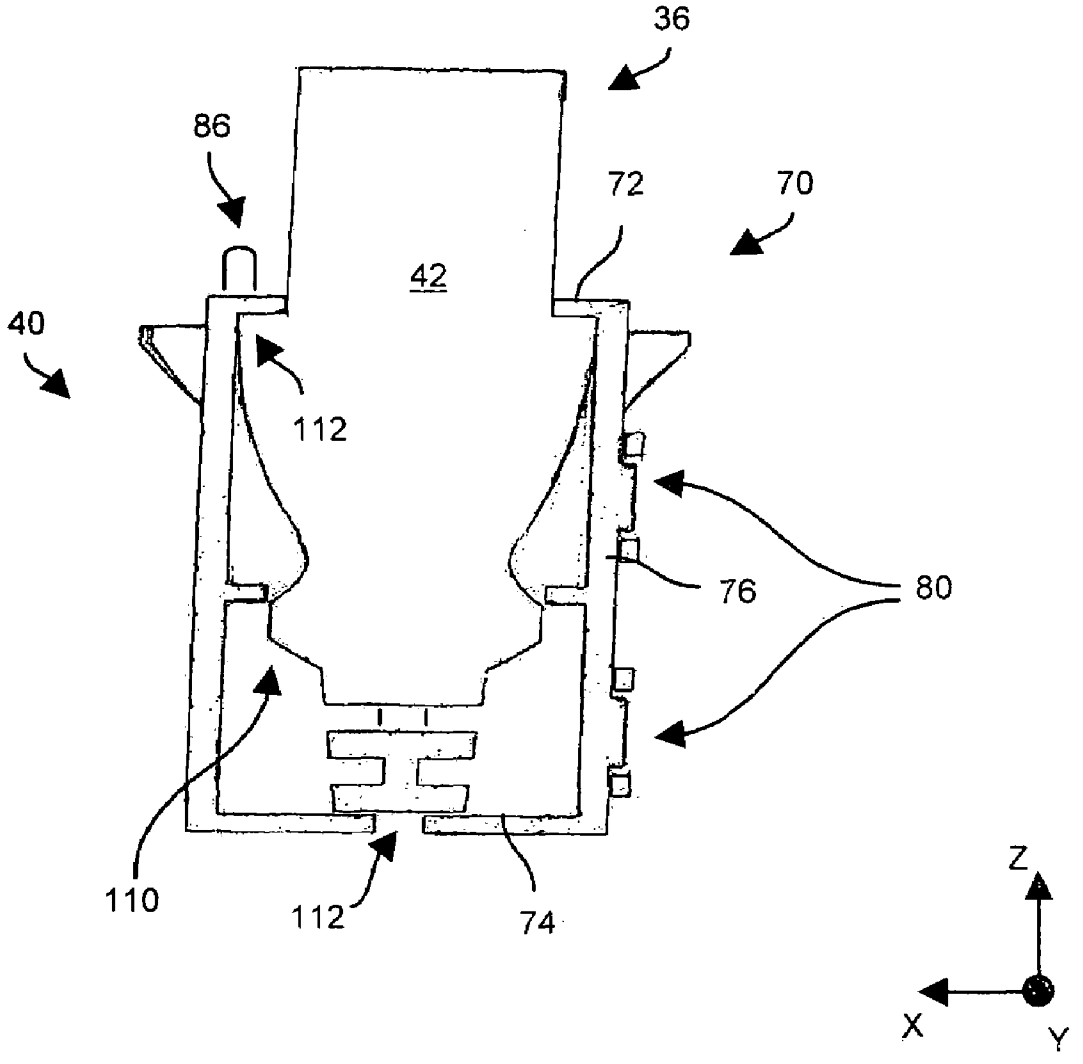
FIG. 6 is a cross-sectional view of the fastening device of FIGS. 2 and 3 when encapsulating a second plug design.

FIG. 6 shows a cross-sectional view of the device 40 and the plug 42 when a plug 42 with a different design than that shown in FIG. 5 is encapsulated within the device 40. As shown, the plug 42 has a curved-profile shape and still nestles within the space 110 within the surfaces 112 defined by the walls 72, 74, 76. In particular, contact against the various wall surfaces 112 rigidly holds the plug 42 in place within the space 110 for a tight, high-precision fit.

It should be understood that the operations shown in FIGS. 5 and 6 enable robust control over plug registration relative to the frame 22. Accordingly, when the user inserts a power supply 32 into the frame 22, the plug 42 properly mates with the power supply connector 48.

In some arrangements, the various features of the body 70 (i.e., the walls 72, 74, 76, etc.) are formed of a rigid, non-conductive polymer (e.g., molded plastic). In some arrangements, the walls 72, 74, 76 form a contiguous, integrated, unitary member. Such arrangements enable high-precision, low-cost, large quantity manufacturing of the device 40 as well as minimize both the number of parts for the fastening device 40 and the complexity of operation in capturing the plug 42 and installing the plug 42 to the frame 22.

As described above, embodiments of the invention are directed to techniques for fastening a plug 42 of a power cord 38 to a frame 22 which is configured to support a power supply 32. Such techniques enable a user connect the power supply 32 to an external power source 30 by simply inserting the power supply 32 into the frame 22 from a front 56 of the system 20. In particular, since the plug 42 of the power cord 38 fastens to the frame 22, a user at the front 56 of the system 20 is able to simply remove a failed power supply 32, and subsequently insert a new power supply 32 in a blind mating manner. That is, the plug 42 of the power cord 38 reliably engages with a corresponding plug 48 at the back of the power supply 32 as the user moves the new power supply 32 into the frame 22. There is no need for the user to go to the back 54 of the system 20 and handle any wires directly. Furthermore, such techniques conveniently facilitate swapping of power supplies 32 while other portions of the data storage system 20 remain in operation.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that data storage system 20 was described above as having two storage processing units 32 by way of example only. In other arrangements, the data storage system 20 has a different number of storage processing units 32 (e.g., one, three, etc.).

Additionally, it should be understood that the various placements of the fastening device features (e.g., the walls 72, 74, 76, the locking structures 80, the tabs 82, the ramped portions 84, the key 86, etc.) were provided in their particular locations for illustration purposes only. In other arrangements, they have other geometries and positions. For example, in connection with the key 86, the key 86 is disposed in other locations in other arrangements. Similarly, the key 86 has other shapes in other arrangements (e.g., rectangular, square, round, etc.). Similar modifications and enhancements apply to other body features as well.

What is claimed is:

1. A data storage system, comprising:
a frame;
operating circuitry supported by the frame; and
a power subsystem configured to power the operating circuitry, the power subsystem including (i) a power supply configured to be supported by the frame, and (ii) a power cord assembly for connecting a power supply to a power source, the power cord assembly having:
a power cord which includes a first plug configured to connect to the power supply, a second plug configured to connect to the power source, and a cable interconnected between the first and second plugs; and
a device configured to fasten the first plug to the frame, the device including a body configured to attach to an installation location of the frame and substantially hold the first plug at the installation location of the frame when the power supply connects with and disconnects from the plug, the body including:
a first end wall,
a second end wall, and
lateral walls which connect the first end wall and the second end wall together; wherein, when the body substantially holds the first plug at the installation location of the frame and when the body is attached to the installation location of the frame, (i) the first end wall is configured to restrain the plug in a positive Z-direction relative to the frame, (ii) the second end wall is configured to restrain the first plug in a negative Z-direction relative to the frame, the negative Z-direction being opposite to the positive Z-direction along a Z-axis, and (iii) the lateral walls are configured to register the first plug relative to the frame in an X-Y plane which is perpendicular to the Z-axis, wherein the first plug of the power cord and the body of the device are separate components, the body of the device being configured to capture the first plug in an interference fit manner and present a physical connection interface of the first plug to the power supply for direct physical mating between the physical connection interface of the first plug and the power supply when the device fastens the first plug to the frame.

2. The data storage system of claim 1 wherein the body includes:
a first member and a second member which form the walls and which are configured to allow the first plug to become encapsulated when in an open position relative to each other, and encapsulate the first plug when in a closed position relative to each other; and wherein the first member defines a set of substantially 90 degree angles, and wherein the second member defines a set of angles which are substantially greater than 90 degrees to control rotational orientation of the first plug relative to the first and second members when the first plug is encapsulated by the first and second members.

3. The data storage system of claim 2 wherein:
the first member includes a first lateral wall of the lateral walls;
the second member includes a second lateral wall of the lateral walls; and
the first plug interposes between the first member and the second member.

4. The data storage system of claim 1 wherein the device is configured to fasten the first plug to the frame such that the first plug cannot be removed from the frame without also removing the device from the frame.

5. The data storage system of claim 1 wherein the body of the device is configured to encapsulate power plugs having differing shapes.

6. A power cord assembly for connecting a power supply to a power source, the power cord assembly comprising:
a power cord having a first plug configured to connect to the power supply, a second plug configured to connect to the power source, and a cable interconnected between the first and second plugs; and
a device for fastening the first plug to a frame which is configured to support the power supply, the device including a body configured to attach to an installation location of the frame and substantially hold the first plug at the installation location of the frame when the power supply connects with and disconnects from the plug, the body including:

a first end wall, a second end wall, and lateral walls which connect the first end wall and the second end wall together; wherein, when the body substantially holds the first plug at the installation location of the frame and when the body is attached to the installation location of the frame, (i) the first end wall is configured to restrain the plug in a positive Z-direction relative to the frame, (ii) the second end wall is configured to restrain the first plug in a negative Z-direction relative to the frame, the negative Z-direction being opposite to the positive Z-direction along a Z-axis, and (iii) the lateral walls are configured to register the first plug relative to the frame in an X-Y plane which is perpendicular to the Z-axis;

wherein the first plug of the power cord and the body of the device are separate components, the body of the device being configured to capture the first plug in an interference fit manner and present a physical connection interface of the first plug to the power supply for direct physical mating between the physical connection interface of the first plug and the power supply when the device fastens the first plug to the frame.

7. The power cord assembly of claim 6 wherein the body includes:

a first member and a second member which are configured to allow the first plug to become encapsulated when in an open position relative to each other, and encapsulate the first plug when in a closed position relative to each other.

8. The power cord assembly of claim 7 wherein the first member defines a set of substantially 90 degree angles, and wherein the second member defines a set of angles which are substantially greater than 90 degrees to control rotational orientation of the first plug relative to the first and second members when the first plug is encapsulated by the first and second members.

9. The power cord assembly of claim 7 wherein the first and second members define a set of open spaces adjacent the first plug when the first plug is encapsulated by the first and second members.

10. The power cord assembly of claim 7 wherein the first and second members are configured to encapsulate power plugs having differing shapes.

11. The power cord assembly of claim 7 wherein:

the first member includes a first lateral wall of the lateral walls;

the second member includes a second lateral wall of the lateral walls; and the first plug interposes between the first member and the second member when the first and second members are in a closed position relative to each other and encapsulate the first plug.

12. The power cord assembly of claim 6 wherein the entire device is formed of non-conductive material.

13. The power cord assembly of claim 6 wherein the body of the device is configured to encapsulate power plugs having differing shapes.

14. A device for fastening a plug of a power cord to a frame which is configured to support a power supply, the device comprising:

a body configured to attach to an installation location of the frame and substantially hold the plug at the installation location of the frame when the power supply connects with and disconnects from the plug, the body including:

a first end wall, a second end wall, and lateral walls which connect the first end wall and the second end wall together; wherein, when the body substantially holds the plug at the installation location of the frame and when the body is attached to the installation location of the frame, (i) the first end wall is configured to restrain the plug in a positive Z-direction relative to the frame, (ii) the second end wall is configured to restrain the plug in a negative Z-direction relative to the frame, the negative Z-direction being opposite to the positive Z-direction along a Z-axis, (iii) the lateral walls are configured to register the plug relative to the frame in an X-Y plane which is perpendicular to the Z-axis;

wherein the plug of the power cord and the body of the device are separate components, the body of the device being configured to capture the plug in an interference fit manner and present a physical connection interface of the plug to the power supply for direct physical mating between the physical connection interface of the plug and the power supply when the device fastens the plug to the frame.

15. The device of claim 14 wherein the body includes:

a first member and a second member which are configured to allow the plug to become encapsulated when in an open position relative to each other, and encapsulate the plug when in a closed position relative to each other.

16. The device of claim 15 wherein the first member defines a set of substantially 90 degree angles, and wherein the second member defines a set of angles which are substantially greater than 90 degrees to control rotational orientation of the plug relative to the first and second members when the plug is encapsulated by the first and second members.

17. The device of claim 15 wherein the first and second members define a set of open spaces adjacent the plug when the plug is encapsulated by the first and second members.

18. The power cord assembly of claim 15 wherein the first and second members are configured to encapsulate power plugs having differing shapes.

19. The device of claim 15 wherein:

the first member includes a first lateral wall of the lateral walls;

the second member includes a second lateral wall of the lateral walls; and the plug interposes between the first member and the second member when the first and second members are in a closed position relative to each other and encapsulate the plug.

20. The device of claim 14 wherein the entire device is formed of non-conductive material.

21. The device of claim 14 wherein the body of the device is configured to encapsulate power plugs having differing shapes.

22. A method for installing a power supply into a data storage system, the method comprising:

fastening a device to a plug of a power cord;

attaching the device to an installation location of a frame of the data storage system; and inserting a power supply into the frame of the data storage system until the power supply mates with the plug of the power cord, the device having a first end wall, a second end wall, and lateral walls which connect the first end wall and the second end wall together; wherein, when the device substantially holds the plug at the installation location of the frame and when the device is attached to the installation location of the frame, (i) the first end wall is configured to restrain the plug in a positive Z-direction relative to the frame, (ii) the second end wall is configured to restrain the plug in a negative Z-direction relative to the frame, the negative Z-direction being opposite to the positive Z-direction along a Z-axis, and (iii) the lateral walls are configured to register the plug relative to the frame in an X-Y plane which is perpendicular to the Z-axis;

wherein the plug of the power cord and the body of the device are separate components, the body of the device being configured to capture the plug in an interference fit manner and present a physical connection interface of the plug to the power supply for direct physical mating between the physical connection interface of the first plug and the power supply when the device fastens the plug to the frame.

23. The method of claim 22 wherein the body includes:

a first member and a second member which form the walls and which are configured to allow the plug to become encapsulated when in an open position relative to each other, and encapsulate the plug when in a closed position relative to each other; and wherein the first member defines a set of substantially 90 degree angles, and wherein the second member defines a set of angles which are substantially greater than 90 degrees to control rotational orientation of the plug relative to the first and second members when the plug is encapsulated by the first and second members.

24. The method of claim 23 wherein:

the first member includes a first lateral wall of the lateral walls;

the second member includes a second lateral wall of the lateral walls; and fastening the device to the plug of the power cord includes interposing the plug between the first member and the second member.

25. The method of claim 22 wherein attaching the device to the installation location of the frame of the data storage system comprises fastening the plug of the power cord to the frame such that the plug cannot be removed from the frame without also removing the device from the frame.

26. The method of claim 22 wherein the body of the device is configured to encapsulate power plugs having differing shapes.

27. The method of claim 22:

wherein the frame includes a mounting element configured to support the power supply; and wherein inserting the power supply into the frame of the data storage system further comprises sliding the power supply into the frame adjacent the mounting element such that the mounting element supports the power supply.

* * * * *